United States Patent
Park et al.

(10) Patent No.: US 10,804,293 B2
(45) Date of Patent: Oct. 13, 2020

(54) NONVOLATILE MEMORY DEVICE, VERTICAL NAND FLASH MEMORY DEVICE AND SSD DEVICE INCLUDING THE SAME

(71) Applicant: SAMSUNG ELECTRONICS CO., LTD., Suwon-si, Gyeonggi-do (KR)

(72) Inventors: Sang-Won Park, Seoul (KR); Sang-Wan Nam, Hwaseong-si (KR); Bong-Soon Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/440,299

(22) Filed: Jun. 13, 2019

(65) Prior Publication Data
US 2020/0135758 A1 Apr. 30, 2020

(30) Foreign Application Priority Data
Oct. 25, 2018 (KR) .................. 10-2018-0127940

(51) Int. Cl.
| | |
|---|---|
| H01L 27/11582 | (2017.01) |
| G11C 16/04 | (2006.01) |
| G11C 16/14 | (2006.01) |
| G11C 16/10 | (2006.01) |
| G11C 16/26 | (2006.01) |
| H01L 27/11573 | (2017.01) |
| G06F 3/06 | (2006.01) |
| H01L 27/1157 | (2017.01) |
| H01L 27/11565 | (2017.01) |

(52) U.S. Cl.
CPC ...... *H01L 27/11582* (2013.01); *G06F 3/0608* (2013.01); *G06F 3/0659* (2013.01); *G06F 3/0679* (2013.01); *G11C 16/0483* (2013.01); *G11C 16/10* (2013.01); *G11C 16/14* (2013.01); *G11C 16/26* (2013.01); *H01L 27/1157* (2013.01); *H01L 27/11573* (2013.01); *H01L 27/11565* (2013.01)

(58) Field of Classification Search
CPC ..... G11C 16/0483; G11C 16/10; G11C 16/14; G11C 16/26; G06F 3/0659; G06F 3/0679
USPC .................................................. 365/185.17
See application file for complete search history.

(56) References Cited

U.S. PATENT DOCUMENTS

| | | |
|---|---|---|
| 6,850,438 B2 | 2/2005 | Lee |
| 7,480,187 B2 | 1/2009 | Hwang |
| | (Continued) | |

*Primary Examiner* — Song Il Cho
(74) *Attorney, Agent, or Firm* — Lee IP Law, PC

(57) ABSTRACT

A nonvolatile memory device includes a semiconductor substrate including a page buffer region, a memory cell array, bitlines, first vertical conduction paths, and second vertical conduction paths. The memory cell array is formed in a memory cell region above the semiconductor substrate and includes memory cells. The bitlines extend in a column direction above the memory cell array. Each of bitlines is cut into each of first bitline segments and each of second bitline segments. The first vertical conduction paths extend in a vertical direction and penetrate a column-directional central region of the memory cell region. The first vertical conduction paths connect the first bitline segments and the page buffer region. The second vertical conduction paths extend in the vertical direction and penetrate the column-directional central region. The second vertical conduction paths connect the second bitline segments and the page buffer region.

20 Claims, 15 Drawing Sheets

(56) References Cited

U.S. PATENT DOCUMENTS

| | | | |
|---|---|---|---|
| 7,616,512 B2 | 11/2009 | Kim et al. | |
| 9,460,793 B1* | 10/2016 | Oh | G11C 16/08 |
| 9,595,346 B2 | 3/2017 | Lee et al. | |
| 9,799,672 B2 | 10/2017 | Son et al. | |
| 9,805,768 B2 | 10/2017 | Oh | |
| 9,893,077 B2 | 2/2018 | Nam et al. | |
| 10,026,747 B2 | 7/2018 | Hwang et al. | |
| 10,566,340 B1* | 2/2020 | Son | H01L 27/11582 |
| 2008/0084746 A1* | 4/2008 | Park | G11C 11/5628 |
| | | | 365/185.17 |
| 2015/0162341 A1* | 6/2015 | Aritome | H01L 27/11556 |
| | | | 257/314 |
| 2015/0206587 A1* | 7/2015 | Hasegawa | H01L 27/11582 |
| | | | 365/185.17 |
| 2016/0118399 A1* | 4/2016 | Son | H01L 27/11526 |
| | | | 365/185.18 |
| 2016/0163386 A1* | 6/2016 | Hwang | G11C 5/025 |
| | | | 365/185.12 |
| 2017/0011996 A1* | 1/2017 | Lee | H01L 27/11575 |
| 2017/0040338 A1* | 2/2017 | Lee | H01L 27/11582 |
| 2019/0035476 A1* | 1/2019 | Lee | G11C 16/24 |
| 2019/0043879 A1* | 2/2019 | Lu | H01L 27/11582 |
| 2019/0341399 A1* | 11/2019 | Tao | H01L 23/5226 |

\* cited by examiner

FIG. 10

| MD | R1 | R2 | R3 | SSLs | MCAs | SWs | SSa | SSb |
|---|---|---|---|---|---|---|---|---|
| PROGRAM READ ← L | 0 | 0 | 0 | SSL1 | MCAa | SWa | H | L |
| | 0 | 0 | 1 | SSL2 | | | | |
| | 0 | 1 | 0 | SSL3 | | | | |
| | 0 | 1 | 1 | SSL4 | | | | |
| | 1 | 0 | 0 | SSL5 | MCAb | SWb | L | H |
| | 1 | 0 | 1 | SSL6 | | | | |
| | 1 | 1 | 0 | SSL7 | | | | |
| | 1 | 1 | 1 | SSL8 | | | | |
| ERASE ← H | DON'T CARE | | | ALL | ALL | ALL | H | H |

NONVOLATILE MEMORY DEVICE, VERTICAL NAND FLASH MEMORY DEVICE AND SSD DEVICE INCLUDING THE SAME

CROSS-REFERENCE TO RELATED APPLICATION

Korean Patent Application No. 10-2018-0127940, filed on Oct. 25, 2018, in the Korean Intellectual Property Office (KIPO), and entitled: "Nonvolatile Memory Device, Vertical NAND Flash Memory Device and SSD Device Including the Same," is incorporated by reference herein in its entirety.

BACKGROUND

1. Field

Embodiments relate to a nonvolatile memory device, a vertical NAND flash memory device, and a solid state drive (SSD) device including the nonvolatile memory device.

2. Discussion of the Related Art

Nonvolatile memory devices may maintain stored data even though power is off. While volatile memory devices are widely used as main memories of various apparatuses, nonvolatile memory devices are widely used for storing program codes and/or data in various electronic devices, such as computers, mobile devices, etc.

SUMMARY

Embodiments are directed to a nonvolatile memory device that includes a semiconductor substrate including a page buffer region, a memory cell array, a plurality of bitlines, a plurality of first vertical conduction paths and a plurality of second vertical conduction paths. The memory cell array is formed in a memory cell region above the semiconductor substrate and includes a plurality of memory cells. The plurality of bitlines extend in a column direction above the memory cell array. Each of the plurality of bitlines is cut into each of a plurality of first bitline segments and each of a plurality of second bitline segments. The plurality of first vertical conduction paths extend in a vertical direction and penetrate a column-directional central region of the memory cell region. The plurality of first vertical conduction paths connect the plurality of first bitline segments and the page buffer region. The plurality of second vertical conduction paths extend in the vertical direction and penetrate the column-directional central region. The plurality of second vertical conduction paths connect the plurality of second bitline segments and the page buffer region.

Embodiments are also directed to a vertical NAND flash memory device having a cell over periphery (COP) structure in which a peripheral circuit is formed on a semiconductor substrate and a memory cell array is stacked on the peripheral circuit, and which includes a semiconductor substrate including a page buffer region, a memory cell array formed in a memory cell region above the semiconductor substrate and including a plurality of cell strings, each cell string including memory cells arranged in a vertical direction, a plurality of bitlines extending in a column direction above the memory cell array, each of the plurality of bitlines being cut into each of a plurality of first bitline segments and each of a plurality of second bitline segments, a plurality of first vertical conduction paths extending in a vertical direction and penetrating a column-directional central region of the memory cell region, the plurality of first vertical conduction paths connecting the plurality of first bitline segments and the page buffer region, and a plurality of second vertical conduction paths extending in the vertical direction and penetrating the column-directional central region, the plurality of second vertical conduction paths connecting the plurality of second bitline segments and the page buffer region.

Embodiments are also directed to a solid state drive (SSD) that includes a plurality of nonvolatile memory devices and an SSD controller configured to control the plurality of nonvolatile memory devices. At least one of the plurality of nonvolatile memory devices includes a semiconductor substrate including a page buffer region, a memory cell array formed in a memory cell region above the semiconductor substrate and including a plurality of memory cells, a plurality of bitlines extending in a column direction above the memory cell array, each of the plurality of bitlines being cut into each of a plurality of first bitline segments and each of a plurality of second bitline segments, a plurality of first vertical conduction paths extending in a vertical direction and penetrating a column-directional central region of the memory cell region, the plurality of first vertical conduction paths connecting the plurality of first bitline segments and the page buffer region, and a plurality of second vertical conduction paths extending in the vertical direction and penetrating the column-directional central region, the plurality of second vertical conduction paths connecting the plurality of second bitline segments and the page buffer region.

BRIEF DESCRIPTION OF THE DRAWINGS

Features will become apparent to those of skill in the art by describing in detail example embodiments with reference to the attached drawings in which:

FIG. 10 illustrates a diagram for describing operations of the nonvolatile memory device of FIG. 9.

DETAILED DESCRIPTION

Hereinafter, a first direction D1 indicates a direction perpendicular to an upper surface of a semiconductor substrate, and a second direction D2 and a third direction D3 indicate two directions parallel to the upper surface of the semiconductor substrate. For example, the second direction and the third direction D3 may be perpendicular to each other. The first direction D1 may be referred to as a vertical direction, the second direction D2 may be referred to as a row direction and the third direction D3 may be referred to as a column direction. The direction indicated by an arrow in figures and the opposite direction may be considered as the same direction.

Figure 1:
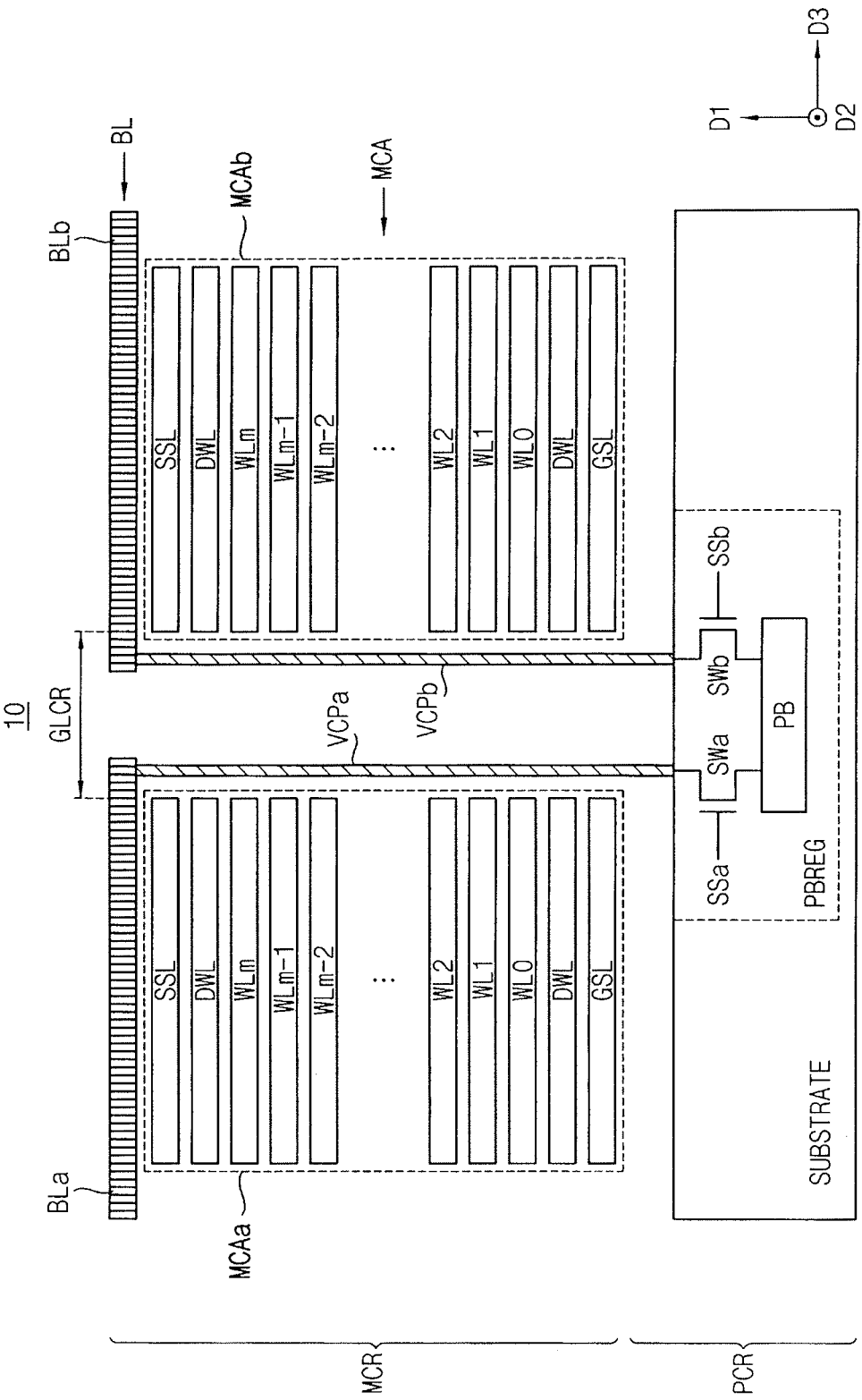
FIG. 1 illustrates a cross-sectional diagram of a nonvolatile memory device according to an example embodiment.

FIG. 1 is a cross-sectional diagram illustrating a nonvolatile memory device according to an example embodiment.

Referring to FIG. 1, a nonvolatile memory device 10 according to an example embodiment includes a semiconductor substrate including a page buffer region PBREG, a memory cell array MCA, a plurality of bitlines BL, a plurality of first vertical conduction paths VCPa, and a plurality of second vertical conduction paths VCPb. FIG. 1 illustrates a configuration corresponding to just one bitline for convenience of illustration. The plurality of bitlines may be arranged repeatedly in the row direction D2 and the corresponding components may be repeated in the row direction D2.

The memory cell array MCA may be formed in a memory cell region MCR above the semiconductor substrate and includes a plurality of memory cells. In an example embodiment, as will be described below, the memory cell array MCA may include a plurality of cell strings, where each cell string includes memory cells arranged in the vertical direction D1 and the nonvolatile memory device 10 may correspond to a vertical NAND flash memory device.

The plurality of bitlines BL may extend in the column direction D3 above the memory cell array MCA. Each of the plurality of bitlines BL may be cut into each of a plurality of first bitline segments BLa and each of a plurality of second bitline segments BLb and, according to the bitline cut, the memory cell array MCA is divided into a first sub array MCAa connected to the plurality of first bitline segments BLa and a second sub array MCAb connected to the plurality of second bitline segments BLb.

The plurality of first vertical conduction paths VCPa may extend in the vertical direction D1 and penetrate a column-directional central region GLCR of the memory cell region MCR. The plurality of first vertical conduction paths VCPa may connect the plurality of first bitline segments BLa and the page buffer region PBREG.

The plurality of second vertical conduction paths VCPb may extend in the vertical direction D1 and penetrate the column-directional central region GLCR. The plurality of second vertical conduction paths VCPb may connect the plurality of second bitline segments BLb and the page buffer region PBREG.

As will be described below with reference to FIG. 4, the column-directional central region GLCR of the memory cell region MCR may correspond to a gate cut region. Thus, the plurality of first vertical conduction paths VCPa and the plurality of second vertical conduction paths VCPb may be formed in the gate cut region.

FIG. 1 illustrates a plurality of gate lines that extend in the row direction D2 and are stacked in the vertical direction D1 to form the memory cell array MCA. The plurality of gate lines may include a string selection line SSL, wordlines WL0~WLm, dummy wordlines DWL and a ground selection line GSL. Although FIG. 1 illustrates one string selection line SSL for each sub array, the string selection line SSL may be divided into a plurality of string selection lines corresponding to the number of cell strings connected to the same bitline so as to select one of the cell strings by the string selection lines.

The memory cell array MCA according to the present example embodiment has a single mat structure that is a unit of a program operation, a read operation and an erase operation. The descriptions of U.S. Pat. Nos. 6,735,116 and 6,724,682, which are incorporated by reference herein in their entireties and for all purposes, may be referred with respect to the single mat structure. The loads of signal lines may be reduced using multiple-mat structure. Further, the loads of the bitlines may be reduced with respect to the single mat structure according to the present example embodiment.

FIG. 1 also illustrates a circuit diagram of the page buffer region PBREG formed in a peripheral circuit region PCR. The page buffer region PBREG may include a plurality of page buffers PB, a plurality of first switches SWa. and a plurality of second switches SWb. The plurality of first switches SWa may electrically connect the plurality of first vertical conduction paths VCPa and the plurality of page buffers PB in response to a first switch signal SSa. The plurality of second switches SWb may electrically connect the plurality of second vertical conduction paths VCPb and the plurality of page buffers PB in response to a second switch signal SSb.

As such, the nonvolatile memory device according to the present example embodiment may reduce the loads of the bitlines and enhance performance through bitline cut.

Figure 2:
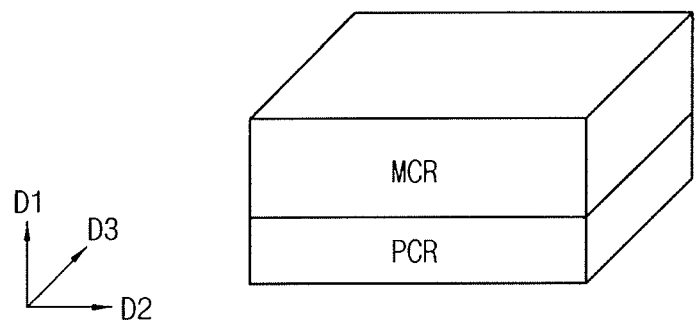
FIG. 2 illustrates a perspective view of a nonvolatile memory device according to an example embodiment.

FIG. 2 is a perspective view of a nonvolatile memory device according to an example embodiment.

Referring to FIG. 2, a nonvolatile memory device may include a peripheral circuit region PCR, in which a peripheral circuit is formed, and a memory cell region MCR, in which a memory cell array is formed.

The peripheral circuit region PCR may include a semiconductor substrate and a peripheral circuit formed at the semiconductor substrate, as will be described below. The page buffer region PBREG in FIG. 1 and the address decoder XDEC in FIG. 8 may be formed in the peripheral circuit region PCR. The memory cell region MCR may include a memory cell array. As such, a size of the nonvolatile memory device may be reduced by adopting a cell over periphery (COP) structure, as illustrated in FIG. 2, in which the peripheral circuit is formed on the semiconductor substrate and the memory cell array is stacked on the peripheral circuit.

Figure 3:
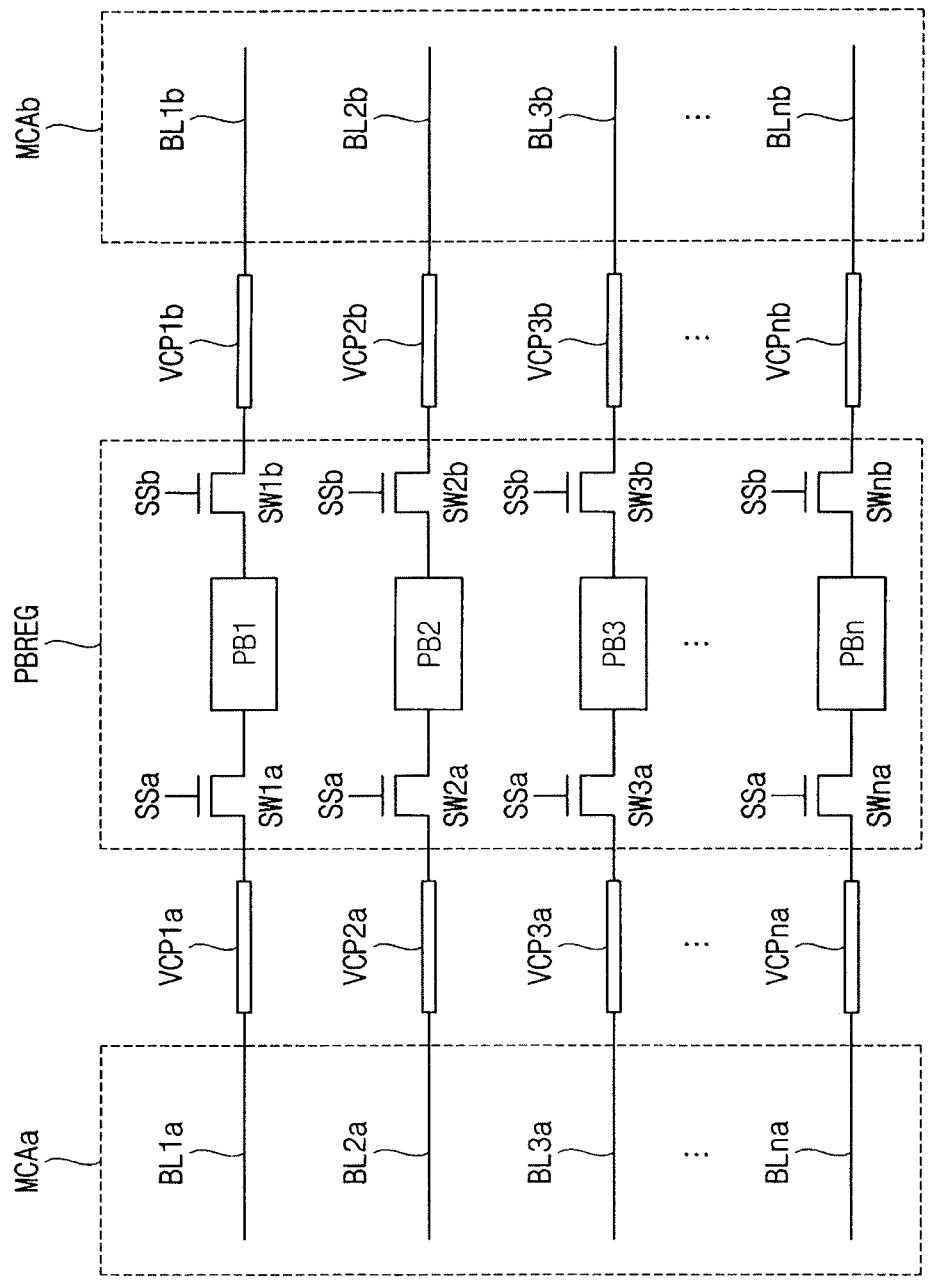
FIG. 3 illustrates a circuit diagram of connections of bitlines of a nonvolatile memory device according to an example embodiment.

FIG. 3 is a circuit diagram illustrating connections of bitlines of a nonvolatile memory device according to an example embodiment.

Referring to FIG. 3, the plurality of first bitline segments BL1a~BLna connected to the first sub array MCAa may be connected to the page buffer region PBREG through the plurality of first vertical conduction paths VCP1a~VCPna. The plurality of second bitline segments BL1b~BLnb connected to the second sub array MCAb may be connected to the page buffer region PBREG through the plurality of second vertical conduction paths VCP1b~VCPnb.

The page buffer region PBREG may include a plurality of page buffers PB1~PBn, a plurality of first switches SW1a~SWna and a plurality of second switches SW1b~SWnb. The plurality of first switches SW1a~SWna may electrically connect the plurality of first vertical conduction paths VCP1a~VCPna and the plurality of page buffers PB1~PBn in response to a first switch signal SSa, respectively. The plurality of second switches SW1b~SWnb may electrically connect the plurality of second vertical conduction paths VCP1b~VCPnb and the plurality of page buffers PB1~PBn in response to a second switch signal SSb, respectively.

Figure 4:
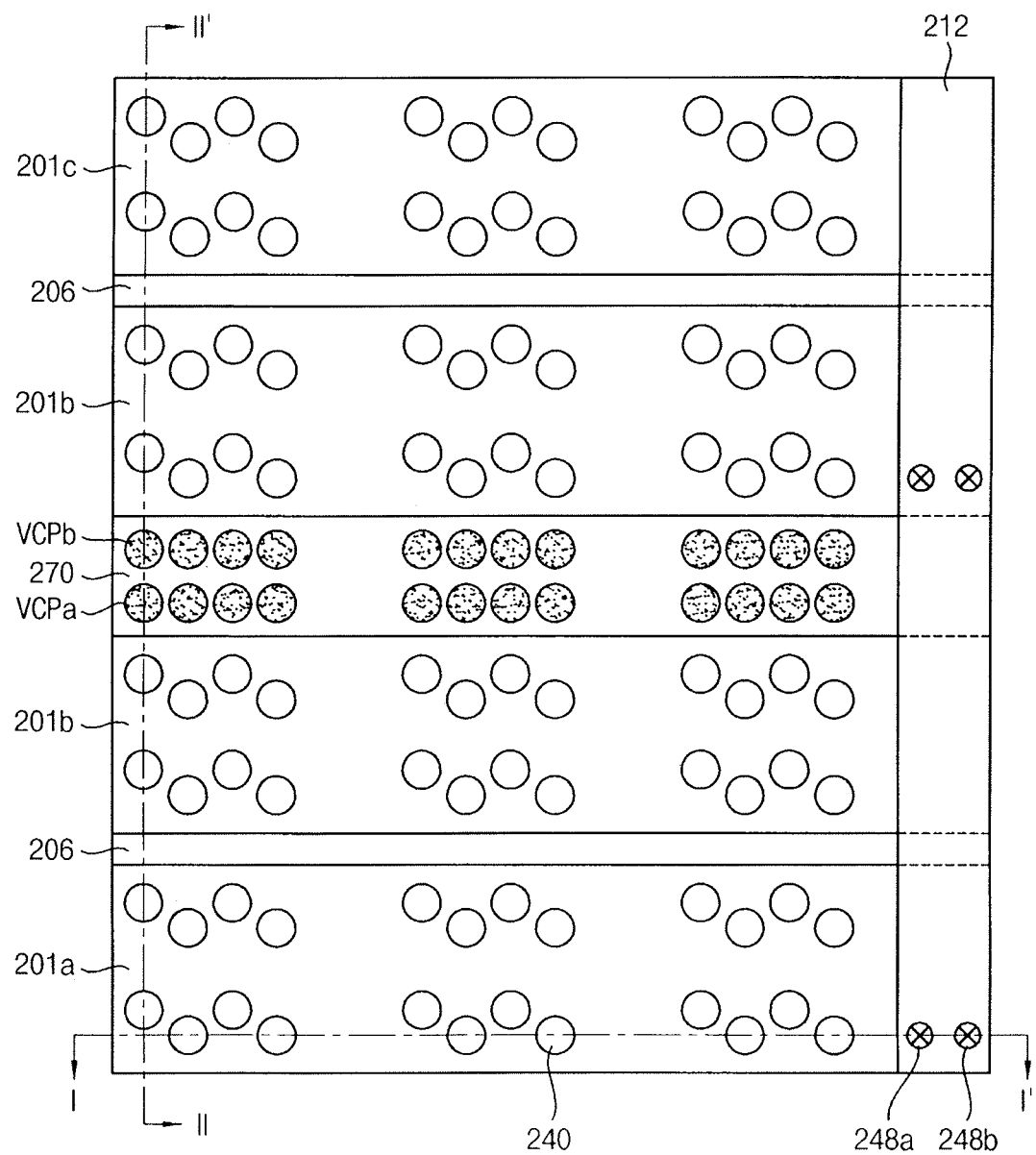
FIG. 4 illustrates a top view of a nonvolatile memory device according to an example embodiment.
Figure 5:
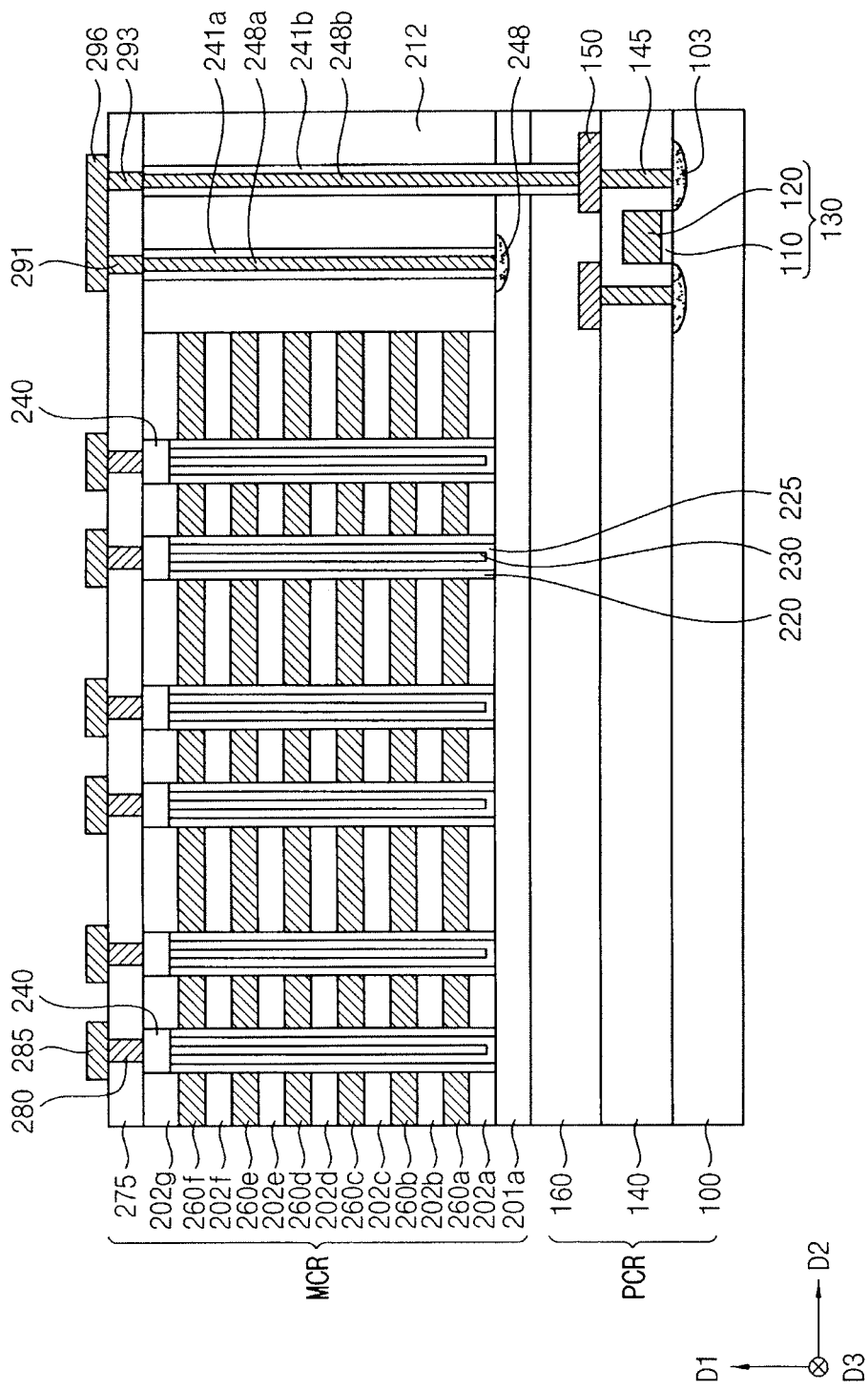
FIG. 5 illustrates a cross-sectional view taken along a line I-I' in FIG. 4.
Figure 6:
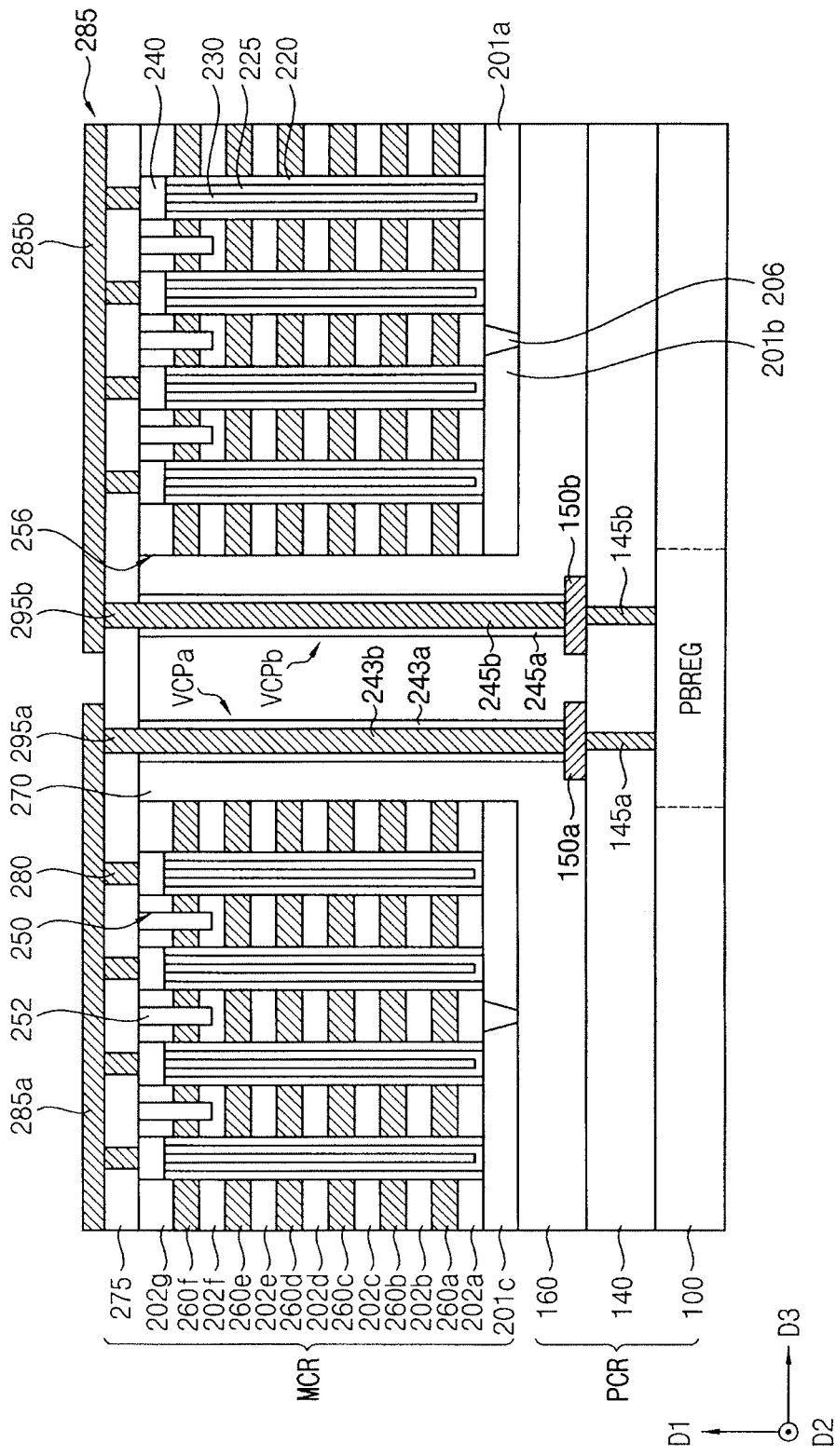
FIG. 6 illustrates a cross-sectional view taken along a line II-IF in FIG. 4.

FIG. 4 is a top view of a nonvolatile memory device according to an example embodiment, FIG. 5 is a cross-sectional view taken along a line I-I' in FIG. 4, and FIG. 6 is a cross-sectional view taken along a line II-II' in FIG. 4.

In an example embodiment, a non-volatile memory device may have a cell over periphery (COP) structure in which a memory cell structure is stacked on a peripheral circuit. The memory cell structure may have a vertical NAND flash memory device structure in which a plurality of NAND flash memory cells are formed in the vertical direction DE with respect to a top surface of a substrate.

For clear and concise description, some elements of the memory device are not shown in FIG. 4. For example, FIG. 4 illustrates base layer patterns 201a, 201b, and 201c, separation layer patterns 206, a mold protection layer 212, a first connecting contact 248a, and a second connecting contact 248b, while other elements described above may be omitted.

Referring to FIGS. 4, 5 and 6, the memory device may include the peripheral circuit region PCR including a peripheral circuit structure and the memory cell region MCR including a memory cell structure.

The peripheral circuit region PCR may include, e.g., a transistor including a gate structure 130 and a source/drain region 103 formed on a substrate 100, lower insulation layers 140 and 160, a lower contact 145, and a lower wiring 150.

The substrate 100 may include a semiconductor material, e.g., single crystalline silicon or single crystalline germanium. The gate structure 130 may include a gate insulation layer pattern 110 and a gate electrode 120, which are stacked on the substrate 100. The transistor may be disposed and defined on the substrate 100.

The gate insulation layer pattern 110 may include, e.g., silicon oxide or a metal oxide. The gate electrode 120 may include, e.g., a metal, a metal nitride, or doped polysilicon. The source/drain region 103 may include n-type or p-type impurities.

A first lower insulation layer 140 may be formed on the substrate 100 to cover a structure, such as the transistor, and the lower contact 145 may extend through the first lower insulation layer 140 to be electrically connected to the source/drain region 103.

The lower wirings 150, 150a and 150b may be disposed on the first lower insulation layer 140, and may be electrically connected to the lower contact 145, 145a and 145b, respectively. A second lower insulation layer 160 may be formed on the first lower insulation layer 140 to cover the lower wirings 150 and 310. FIGS. 5 and 6 illustrates an example where the lower wirings 150, 150a and 150b are formed in the same layer, but the lower wirings 150, 150a and 150b may be distributed in different wiring layers.

The first and second lower insulation layers 140 and 160 may include an insulating material, e.g., silicon oxide. The lower contacts 145, 145a and 145b, and the lower wirings 150, 150a and 150b may include, e.g., a metal, a metal nitride or doped polysilicon.

The memory cell region MCR may include first to third base layer patterns 201a, 201b, and 201c, a channel 225, a gate line 260, a bit line 285, and a connecting wiring 296, etc.

The separation layer pattern 206 may extend in the second direction D2, and a plurality of the separation layer patterns 206 may be arranged along the third direction D3. Thus, a base layer may be physically divided into the first to third base layer patterns 201a, 201b, and 201c. FIGS. 4 to 6 illustrate three base layer patterns 201a, 201b, and 201c as an example.

The base layer patterns 201a, 201b, and 201c may include polysilicon or single crystalline silicon. In an example embodiment, the base layer patterns 201a, 201b, and 201c may further include p-type impurities such as boron (B). In this case, the base layer patterns 201a, 201b, and 201c may serve as a p-type well.

The separation layer pattern 206 may be extended linearly in the second direction D2. The base layer patterns 201a, 201b, and 201c may be physically separated by the separation layer pattern 206. The separation layer pattern 206 may include an insulation layer pattern, e.g., silicon oxide.

The channel 225 may be disposed on the base layer patterns 201a, 201b, and 201c, and may extend in the first direction D1 from top surfaces of the base layer patterns 201a, 201b, and 201c. The channel 225 may have a hollow cylindrical shape or a cup shape. The channel 225 may include, e.g., polysilicon or single crystalline silicon, and may include an impurity region doped with, e.g., p-type impurities such as boron.

A plurality of the channels 225 may be arranged in the second direction D2 to form a channel row, and a plurality of the channel rows may be arranged in the third direction D3. In an example embodiment, the channels 225 included in the neighboring channel rows may be arranged in a zigzag arrangement to face one another. Thus, a density of the channels 225 in a unit area of the base layer pattern 201a, 201b, and 201c may be increased.

A filling layer pattern 230 may be formed in an inner space of the channel 225. The filling layer pattern 230 may have a pillar shape or a solid cylindrical shape. The filling layer pattern 230 may include an insulation layer pattern, e.g., silicon oxide.

According to an embodiment, the channel 225 may have a pillar shape or a solid cylindrical shape. In an example embodiment, the filling layer pattern 230 may be omitted.

A dielectric layer structure 220 may be formed on an outer sidewall of the channel 225. The dielectric layer structure 220 may have a cup shape of which a central bottom is opened, or a straw shape.

The dielectric layer structure 220 may include a tunnel insulation layer, a charge storage layer, and a blocking layer, which may be sequentially stacked from the outer sidewall of the channel 225. The blocking layer may include, e.g., silicon oxide or a metal oxide such as hafnium oxide or aluminum oxide. The charge storage layer may include, e.g., a nitride such as silicon nitride or a metal oxide, and the tunnel insulation layer may include, e.g., an oxide such as silicon oxide. For example, the dielectric layer structure 220 may have an oxide-nitride-oxide (ONO) layers-stacked structure.

A pad 240 may be formed on the filling layer pattern 230, the channel 225, and the dielectric layer structure 220. For example, the filling layer pattern 230, the channel 225, and the dielectric layer structure 220 may be capped or closed by the pad 240. The pad 240 may include a polysilicon or single crystalline silicon. The pad 240 may further include n-type impurities, e.g., phosphorus (P) or arsenic (As).

As illustrated in FIG. 5, a plurality of the pads 240 may be arranged in the second direction D2 to form a pad row substantially comparable to the channel row. A plurality of the pad rows may be arranged in the third direction D3.

The gate lines 260 (e.g., 260a through 260f) may be disposed on an outer sidewall of the dielectric layer structure 220 and may be spaced apart from one another in the first direction D1. In an example embodiment, each gate line 260 may surround the channels 225 of at least one channel row and may be extended in the second direction D2.

For example, as illustrated in FIGS. 4 to 6, each gate line 260 may surround six channel rows, although the number of channel rows surrounded by each gate line 260 may be varied.

The gate line 260 may include a metal having a low electrical resistance and/or a nitride thereof. For example, the gate line 260 may include tungsten (W), tungsten nitride, titanium (Ti), titanium nitride, tantalum (Ta), tantalum nitride, platinum (Pt), or the like. In an example embodiment, the gate line 260 may have a multi-layered structure including a barrier layer formed of a metal nitride and a metal layer. As will be described below with reference to FIG. 10, one or more of the gate lines 260 may be a stopper line. The stopper line may be formed of polysilicon for an appropriate etch rate according to a manufacturing process.

For example, a lowermost gate line 260a may serve as a ground selection line (GSL). Four gate lines 260b, 260c, 260d, and 260e on the GSL may serve as word lines. An uppermost gate line 260f on the word lines may serve as a string selection line (SSL). In this case, the GSL 260a, the word lines 260b, 260c, 260d, and 260e, and the SSL 260f may be formed at a single level, four levels and a single level, respectively. Each of the number of levels of the GSL, the word line, and the SSL may be varied. According to an example embodiment, the GSL and the SSL may be formed at two levels, and the word lines may be formed at 2^n levels, such as 4, 8, or 16 levels. The stacked number of the gate lines 260 may be determined in consideration of a circuit design and a degree of integration of the semiconductor device.

Insulating interlayers 202 (e.g., 202a to 202g) may be disposed between the gate lines 260 along the first direction D1. The insulating interlayers 202 may include, e.g., a silicon oxide based material, e.g., silicon dioxide ($SiO_2$), silicon oxycarbide (SiOC), or silicon oxyfluoride (SiOF). The gate lines 260 may be insulated from one another along the first direction D1 by the insulating interlayers 202.

A gate line cut region 256 may be formed through the gate lines 260 and the insulating interlayers 202 along the first direction D1. The gate line cut region 256 may have a trench shape or a ditch shape extending in the second direction D2. As described above, the plurality of first vertical conduction paths VCPa and the plurality of second vertical conduction paths VCPb may be formed in the gate line cut region 256 corresponding to the central region of the memory cell array along the third direction D3 or the column direction.

A gate line cut pattern 270 extending in the second direction D2 may be disposed in the gate line cut region 256. The gate line cut patterns 270 may be arranged along the third direction D3. The gate line cut pattern 270 may include an insulation layer pattern, e.g., silicon oxide.

In an example embodiment, a cell block sharing the gate lines 260 may be defined by the gate line cut pattern 270. The cell block may be divided into sub-cell blocks by the separation layer pattern 206. Thus, a dimension or a size of an individual block may be reduced, so that a segmented operational control may be achieved, In an example embodiment, one of the gate line cut patterns 270 may be provided per each base layer pattern 201a, 201b, and 201c. As illustrated in FIG. 6, e.g., the gate line cut pattern 270 may be disposed at a central region of the second base layer pattern 201b.

A connecting contact and a connecting wiring may be provided per each base layer pattern 201a, 201b, and 201c to transfer an electrical signal and/or a voltage from a peripheral circuit.

In an example embodiment, the mold protection layer 212 may be formed on lateral portions of the base layer pattern 201a, 201b, and 201c, and the separation layer pattern 206. The first connecting contact 248a may extend through the mold protection layer 212 to make contact with a impurity region 248 formed at the lateral portion of the base layer pattern 201a, 201b, and 201c. The second connecting contact 248b may extend through the mold protection layer 212, the base layer patterns 201a, 201b, and 201c, and the second lower insulation layer 160 to make contact with the lower wiring 150. A first insulation layer pattern 241a and a second insulation layer pattern 241b may be formed on sidewalls of the first connecting contact 248a and the second connecting contact 248b, respectively.

A first plug 291 and a second plug 293 may extend through an upper insulation layer 275 to be in contact with the first connecting contact 248a and the second connecting contact 248b, respectively. The connecting wiring 296 may be disposed on the upper insulation layer 275 to electrically connect the first and second plugs 291 and 293.

An upper gate line cut pattern 252 may be formed in an upper gate line cut region 250. The upper gate line cut pattern 252 may include an insulation material, e.g., silicon oxide.

In an example embodiment, the upper gate line cut region 250 or the upper gate line cut pattern 252 may be provided for a separation of the SSL in each cell block. In this case, the upper gate line cut region 250 or the upper gate line cut pattern 252 may extend through an uppermost insulating interlayer 202g and the SSL 260f, and may extend partially through an insulating interlayer 202f directly under the SSL 260f.

The upper insulation layer 275 may be formed on the uppermost insulating interlayer 202g, the pad 240, the upper gate line cut pattern 252, the gate line cut pattern 270, the first connecting contact 248a, and the second connecting contact 248b.

A bit line contact 280 may be formed through the upper insulation layer 275 to make contact with the pad 240. A plurality of the bit line contacts 280 may be formed to define an array comparable to an arrangement of the channels 225 or the pads 240.

The bit line 285 may be disposed on the upper insulation layer 275 to be electrically connected to the bit line contact 280. For example, the bit line 285 may extend in the third direction D3 to be electrically connected to a plurality of the bit line contacts 280. The bit line 285 and the separation layer pattern 206 may extend in substantially the same direction.

According to example embodiments described above, the base layer patterns 201a, 201b, and 201c may be physically separated by the separation layer pattern 206. Thus, the first to third base layer patterns 201a, 201b, and 201c may be operated independently or individually.

The cell block may be further segmented or divided by the separation layer pattern 206, and thus signal interference or disturbance due to a large size of the cell block may be reduced. Thus, reliability of the semiconductor device may be increased.

As described above, the bitline 285 may be cut at the gate line cut region 256 into the first bitline segment 285a and the second bitline segment 285b. The first vertical conduction path VCPa and the second vertical conduction path VCPb may be formed in the gate line cut region 256. The first vertical conduction path VCPa and the second vertical conduction path VCPb may have a through-hole via (THV) structure. The first vertical conduction path VCPa and the second vertical conduction path VCPb may include the vertical contacts 243b, 245b and the insulation layer patterns 243a and 245a may be formed on sidewalls of the vertical contacts 243b and 245b, respectively.

Figure 7:
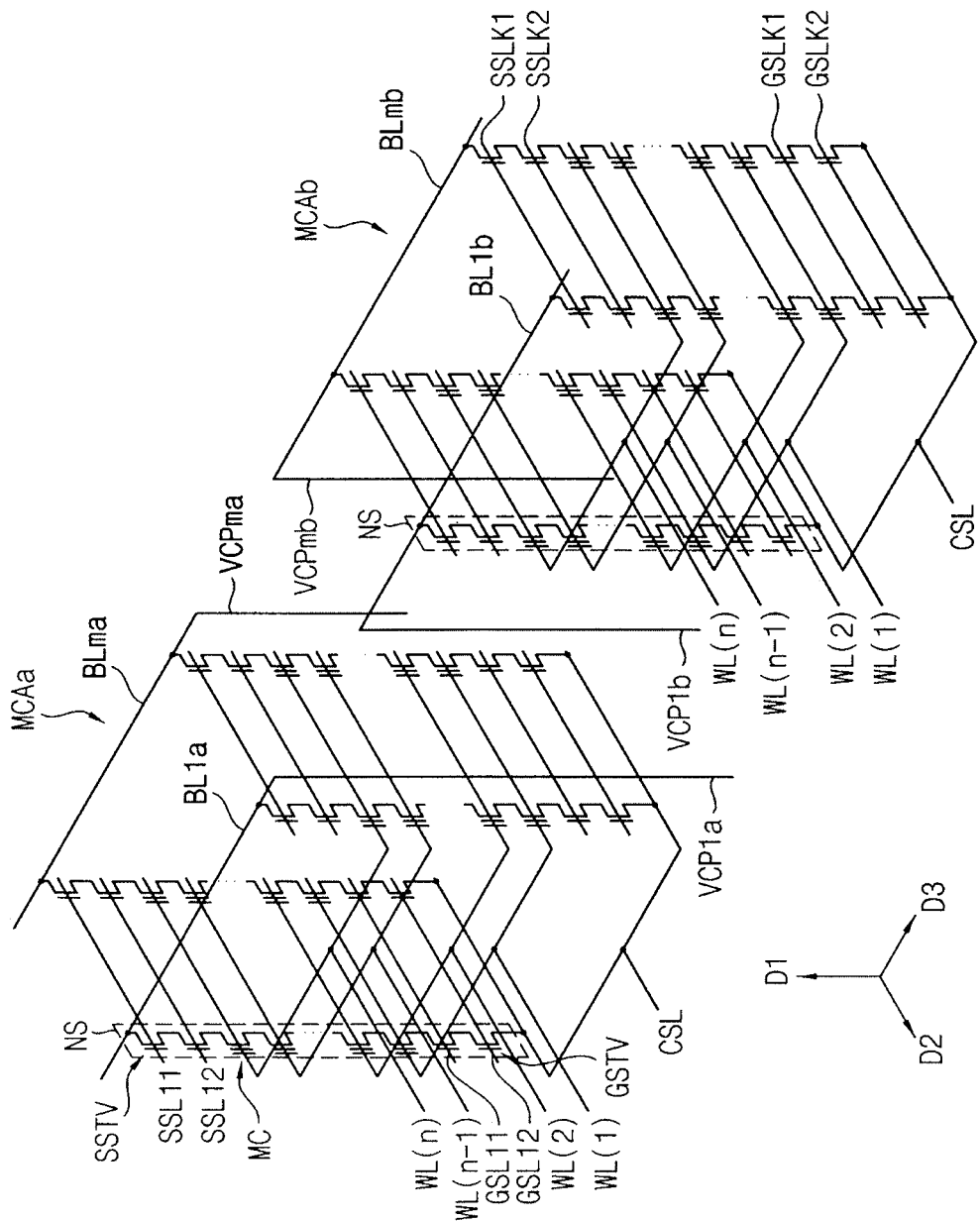
FIG. 7 illustrates a circuit diagram of an example of a memory cell array included in a nonvolatile memory device according to an example embodiment.

FIG. 7 is a circuit diagram illustrating an example of a memory cell array included in a nonvolatile memory device according to an example embodiment.

Referring to FIG. 7, a memory cell array may include a plurality of cell strings or NAND strings NS, each of which has a vertical structure. The plurality of NAND strings NS may be formed in the second direction D2 to define a string column, and a plurality of string columns may be formed in the third direction D3 to define a string array. The NAND string NS may include string selection transistors SSTV, ground selection transistors GSTV, and a plurality of memory cells MC that are formed in a first direction D1 and are connected in series between a plurality of bitlines BL1~BLm and common source line CSL.

As described above, the plurality of bitlines BL1~BLm extends in the column direction D3 above the memory cell array MCA. Each of the plurality of bitlines BL1~BLm may be cut into each of a plurality of first bitline segments BL1a~BLma and each of a plurality of second bitline segments BL1b~BLmb. According to the bitline cut, the memory cell array MCA may be divided into a first sub array MCAa connected to the plurality of first bitline segments BL1a~BLma and a second sub array MCAb connected to the plurality of second bitline segments BL1b~BLmb.

The plurality of first vertical conduction paths VCP1a~VCPma may extend in the vertical direction D1 and penetrate a column-directional central region of the memory cell region MCR. The plurality of first vertical conduction paths VCP1a~VCPma may connect the plurality of first bitline segments BL1a~BLma and the page buffer region. The plurality of second vertical conduction paths VCP1b~VCPmb may extend in the vertical direction D1 and penetrate the column-directional central region. The plurality of second vertical conduction paths VCP1b~VCPmb may connect the plurality of second bitline segments BL1b~BLmb and the page buffer region.

The string selection transistors SSTV may be connected to string select lines SSL11~SSLk1 and SSL12~SSLk2, and the ground selection transistors GSTV may be connected to ground selection lines GSL11~GSLk1 and GSL12~GSLk2. The memory cells in the same layer may be connected to the same wordline among wordlines WL(1)~WL(n). The string selection lines SSL11~SSLk1 and SSL12~SSLk2 and the ground selection lines GSL11~GSLk1 and GSL12~GSLk2 may extend in the second direction and arranged in the third direction D3. The wordlines WL(1)~WL(n) may extend in the second direction D2 and the third direction D3 and arranged in the first direction D1. The bitlines BL1~BLm may extend in the third direction D3 and arranged in the second direction D2. The memory cells MC may be controlled by a voltage on the wordlines WL(1)~WL(n).

As for a two-dimensional flash memory device, the vertical or three-dimensional flash memory device may perform the read operation and the write operation in a page unit and may perform the erase operation in a block unit.

In an example embodiment, two string selection transistors included in a single NAND string may be connected to a single string selection line, and two ground selection transistors included in the single NAND string may be connected to a single ground selection line. In other example embodiments, the single NAND string may include one string selection transistor and one ground selection transistor.

Figure 8:
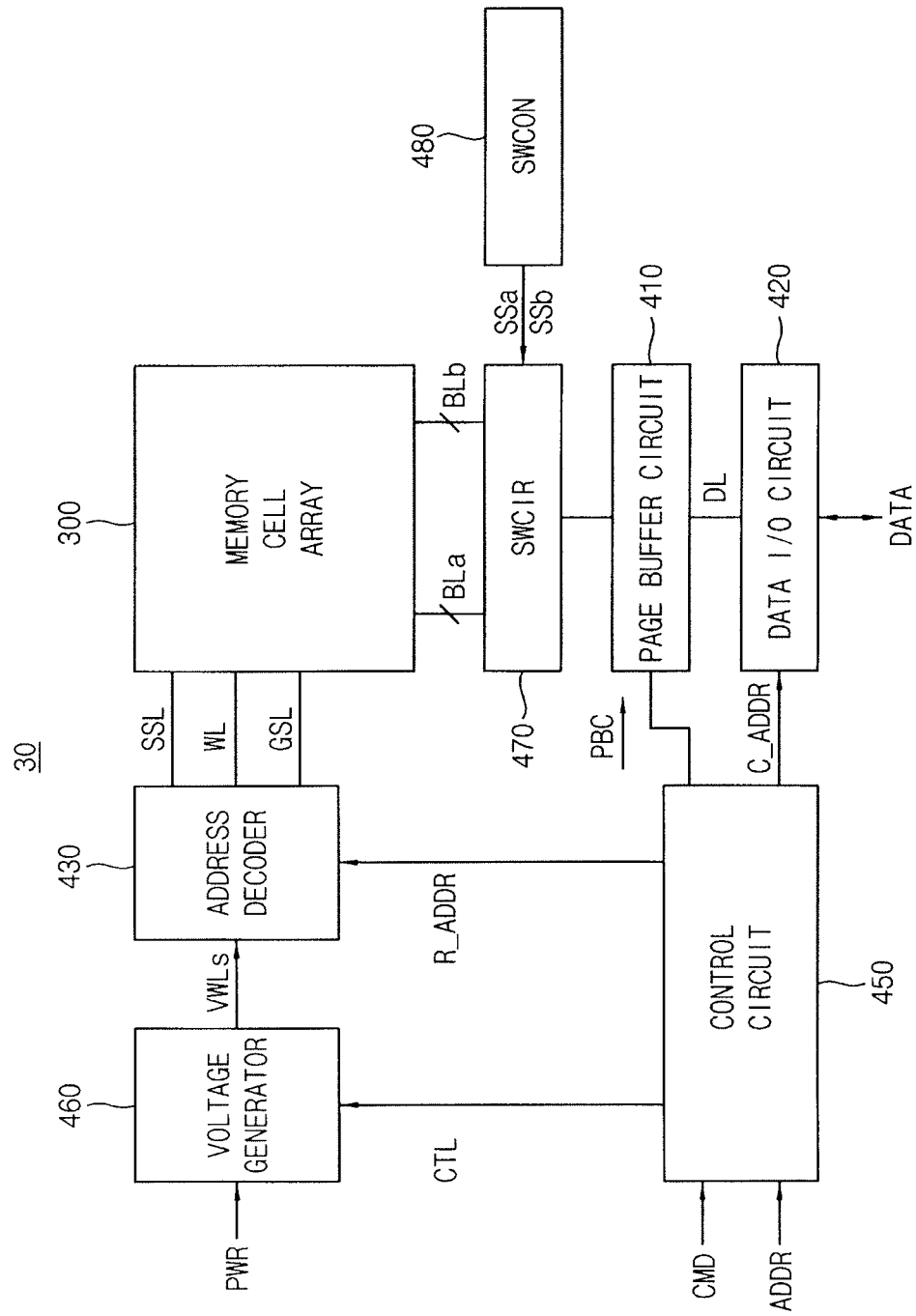
FIG. 8 illustrates a block diagram of a nonvolatile memory device according to an example embodiment.

FIG. 8 is a block diagram illustrating a nonvolatile memory device according to an example embodiment.

Referring to FIG. 8, a nonvolatile memory device 30 may include a memory cell array 300, a page buffer circuit 410, a data input/output (I/O) circuit 420, an address decoder 430, a control circuit 450, a voltage generator 460, a switch circuit SWCIR 470, and a switch control circuit SWCON 480.

The memory cell array 300 may be coupled to the address decoder 430 through a plurality of string selection lines SSL, a plurality of word lines WL, and a plurality of ground selection lines GSL. In addition, the memory cell array 300 may be coupled to the page buffer circuit 410 through a plurality of bit lines BL.

The memory cell array 300 may include a plurality of memory cells coupled to the plurality of word lines WL and the plurality of bit lines BL. In an example embodiment, the memory cell array 300 may be a three-dimensional memory cell array that is formed on a substrate in a three-dimensional structure (or a vertical structure). In this case, the memory cell array 300 may include a plurality of NAND strings that are vertically oriented such that at least one memory cell is located over another memory cell.

The control circuit 450 may receive a command (signal) CMD and an address (signal) ADDR from a memory controller, and control erasing, programming, and read operations of the nonvolatile memory device 30 based on the command signal CMD and the address signal ADDR. An erase operation may include performing a sequence of erase loops, and a program operation may include performing a sequence of program loops. Each erase loop may include an erase operation and an erase verification operation. Each program loop may include a program operation and a program verification operation. The read operation may include a normal read operation and a data recover read operation.

For example, the control circuit 450 may generate control signals CTL, which are used for controlling the voltage generator 460, and may generate a page buffer control signal PBC for controlling the page buffer circuit 410, based on the command signal CMD, and generate a row address R_ADDR and a column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 300 through the plurality of string selection lines SSL, the plurality of word lines WL, and the plurality of ground selection lines GSL. During the program operation or the read operation, the address decoder 430 may determine one of the plurality of word lines WL as a selected word line and determine the rest of the plurality of word lines WL except for the selected word line as unselected word lines, based on the row address R_ADDR.

In addition, during the program operation or the read operation, the address decoder 430 may determine one of the plurality of string selection lines SSL as a selected string selection line and determine the rest of the plurality of string selection lines SSL except for the selected string selection line as unselected string selection lines, based on the row address R_ADDR.

The voltage generator 460 may generate word line voltages VWL for the operation of the memory cell array 300 of the nonvolatile memory device 30, based on the control signals CTL. The voltage generator 460 may receive power PWR from the memory controller. The word line voltages VWL may be applied to the plurality of word lines WL through the address decoder 430.

For example, during the program operation, the voltage generator 460 may apply a program voltage to the selected word line and may apply a program pass voltage to the unselected word lines. In addition, during the program verification operation, the voltage generator 460 may apply a program verification voltage to the selected word line and may apply a verification pass voltage to the unselected word lines.

In addition, during the normal read operation, the voltage generator 460 may apply a read voltage to the selected word line and may apply a read pass voltage to the unselected word lines. During the data recover read operation, the voltage generator 460 may apply the read voltage to a word line adjacent to the selected word line and may apply a recover read voltage to the selected word line.

The page buffer circuit 410 may be coupled to the memory cell array 300 through the plurality of bit line segments BL1 and BLb. The page buffer circuit 410 may include a plurality of buffers. In an example embodiment, each of the plurality of buffers may be connected to only one bit line pair BLa and BLb. In other example embodiments, each of the plurality of buffers may be connected to two or more bit line pairs BLa and BLb.

The page buffer circuit 410 may temporarily store data to be programmed in a selected page or data read out from the selected page of the memory cell array 300.

The data input/output circuit 420 may be coupled to the page buffer circuit 410 through data lines DL. During the program operation, the data input/output circuit 420 may receive program data DATA received from the memory controller and provide the program data DATA to the page buffer circuit 410 based on the column address C_ADDR received from the control circuit 450. During the read operation, the data input/output circuit 420 may provide read data DATA, having been read from the memory cell array 300 and stored in the page buffer circuit 410, to the memory controller based on the column address C_ADDR received from the control circuit 450.

In addition, the page buffer circuit 410 and the data input/output circuit 420 may read data from a first area of the memory cell array 300 and write this read data to a second area of the memory cell array 300 (e.g., without transmitting the data to a source external to the nonvolatile memory device 30, such as to the memory controller). Thus, the page buffer circuit 410 and the data input/output circuit 420 may perform a copy-back operation.

The switch circuit 470 may include a plurality of first switches and a plurality of second switches as described above. The switch control circuit 480 may generate a first switch signal SSa and a second switch signal SSb based on a mode signal an access address, where the mode signal may indicate a program operation, a read operation or an erase operation and the access address may determine selected memory cells among the plurality of memory cells, as will be described below.

Figure 9:
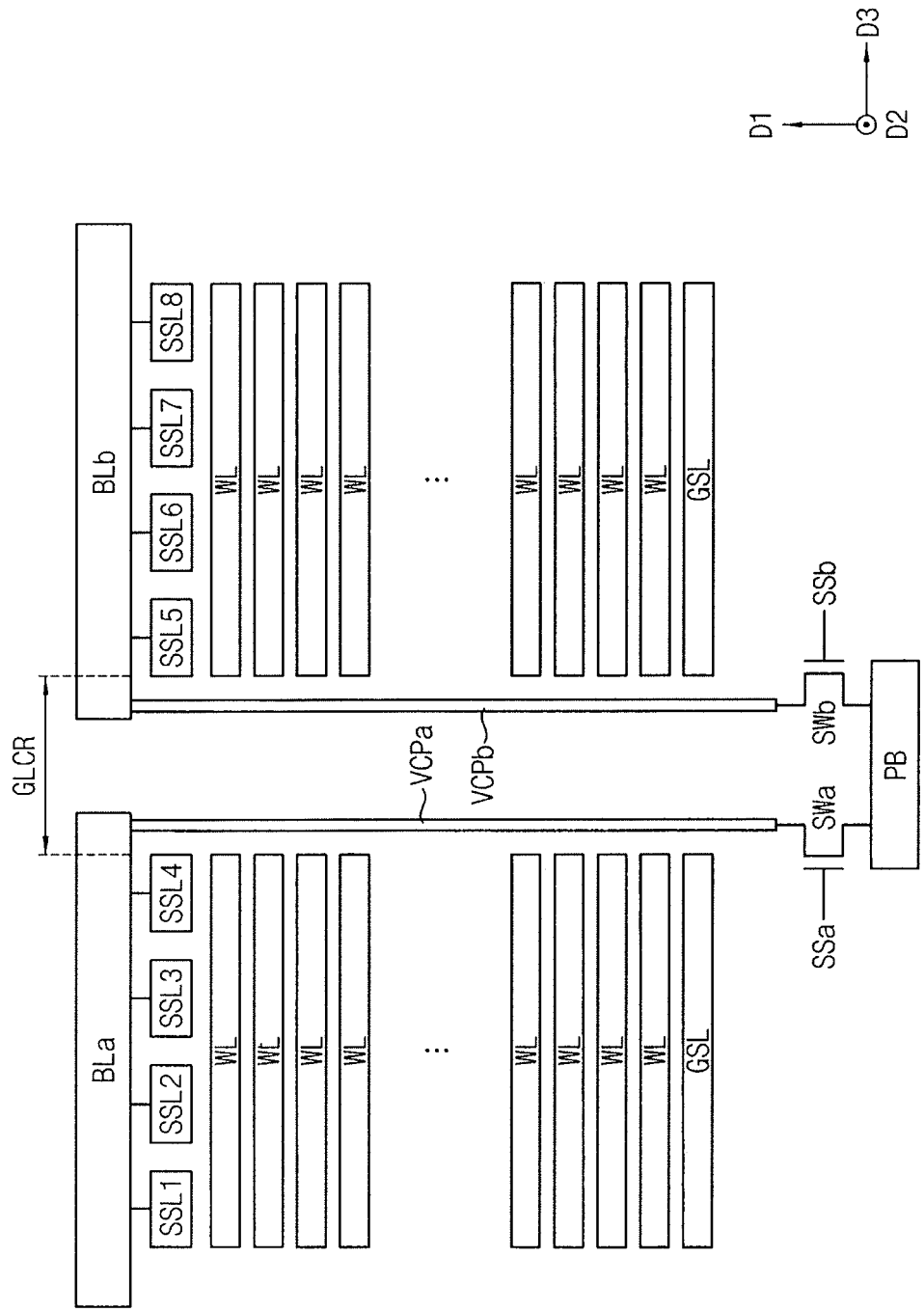
FIG. 9 illustrates a cross-sectional diagram of a nonvolatile memory device according to an example embodiment.

FIG. 9 is a cross-sectional diagram illustrating a nonvolatile memory device according to an example embodiment. The structure of FIG. 9 is similar to that of FIG. 1, and repeated descriptions may be omitted.

Referring to FIG. 9, a nonvolatile memory device according to the present example embodiment includes a plurality of page buffers formed in a semiconductor substrate, a memory cell array, a plurality of bitlines BL, a plurality of first switches SWa, a plurality of second switches SWb, a plurality of first vertical conduction paths VCPa, and a plurality of second vertical conduction paths VCPb. FIG. 9 illustrates a configuration corresponding to just one bitline for convenience of illustration. The plurality of bitlines may be arranged repeatedly in the row direction D2 and the corresponding components may be repeated in the row direction D2.

The memory cell array may be formed in a memory cell region above the semiconductor substrate and include a plurality of memory cells. In an example embodiment, as will be described below, the memory cell array may include a plurality of cell strings, where each cell string includes memory cells arranged in the vertical direction DE and the nonvolatile memory device may correspond to a vertical NAND flash memory device.

The plurality of bitlines BL may extend in the column direction D3 above the memory cell array. Each of the plurality of bitlines BL may be cut into each of a plurality of first bitline segments BLa and each of a plurality of second bitline segments BLb. According to the bitline cut, the memory cell array MCA is divided into a first sub array connected to the plurality of first bitline segments BLa and a second sub array connected to the plurality of second bitline segments BLb.

The plurality of first vertical conduction paths VCPa may extend in the vertical direction D1 and penetrate a column-directional central region GLCR of the memory cell region MCR. The plurality of first vertical conduction paths VCPa may connect the plurality of first bitline segments BLa and the plurality of page buffers PB through the plurality of first switches SWa.

The plurality of second vertical conduction paths VCPb may extend in the vertical direction D1 and penetrate the column-directional central region GLCR. The plurality of second vertical conduction paths VCPb may connect the plurality of second bitline segments BLb and the plurality of page buffer PB through the plurality of second switches SWb.

As an example, FIG. 9 illustrates eight string selection lines SSL1~SSL8 connected to each bitline BL including each first bitline segment BLa and each second bitline segment BLb for convenience of illustration and description. The number of string selection lines corresponds to the number of cell strings connected to the same bitline so as to select one of the cell strings by the string selection lines. Hereinafter, SSL1~SSL8 may indicate the string selection lines or string selection signals transferred through the string selection lines.

FIG. 10 is a diagram for describing operations of the nonvolatile memory device of FIG. 9.

FIG. 10 illustrates logic values (0 or 1) of first, second, and third bits R1, R2, and R3 among bits of the access address, a selected string selection signal SSLs, a selected sub array MCAs, a selected switch SWs, and logic levels (L or H) of a mode signal MD, a first switch signal SSa and a second switch signal SSb. The first, second, and third bits R1, R2, and R3 are for generating the string selection signals SSL1~SSL8, and the selected string selection signal SSLs indicates one of the string selection signals SSL1~SSL8, which is activated based on the first, second, and third bits R1, R2, and R3. FIG. 10 illustrates an example for describing the selective connection of the first vertical conduction paths VCPa and the second vertical conduction paths VCPb, and the logic values or the logic levels may be determined variously.

Referring to FIG. 10, the string selection signals SSL1~SSL8 may be selectively activated as the selected string selection signal SSLs according to the values of the first, second, and third bits R1, R2, and R3, and the cell string connected to the selected string selection signal SSLs may be connected to the bitline. In the example of FIG. 10, the first bit R1 is one bit of the access address that indicates whether the selected memory cells are included in the first sub array MCAa or the second sub array MCAb. Thus, the first sub array MCAa is selected when the first bit R1 is 0 and the second sub array MCAb is selected when the first bit R2 is 1.

For example, the nonvolatile memory device may perform a program operation or a read operation when the mode signal MD is the logic low level L and perform an erase operation when the mode signal MD is the logic high level H.

When the mode signal MD indicates the program operation or the read operation, the switch control circuit 480 in FIG. 9 may activate selectively one of the first switch signal SSa and the second switch signal SSb based on the string selection signals SSL1~SSL8 that are provided by decoding the access address. Thus, one of the plurality of first switches SWa and the plurality of second switches SWb may be selectively turned on in the program operation and the read operation. Accordingly, one of the plurality of first bitline segments BLa and the plurality of second bitline segments BLb may be electrically connected to the plurality of page buffers PB included in the page buffer region PBREG during the program operation and the read operation.

When the mode signal MD indicates the erase operation, the switch control circuit 480 may activate both of the first switch signal SSa and the second switch signal SSb regardless of the access address. Thus, both of the plurality of first switches SWa and the plurality of second switches SWb may be turned on in the erase operation. Accordingly, both of the plurality of first bitline segments BLa and the plurality of second bitline segments BLb may be electrically connected to the plurality of page buffers PB during the erase operation.

Figure 11:
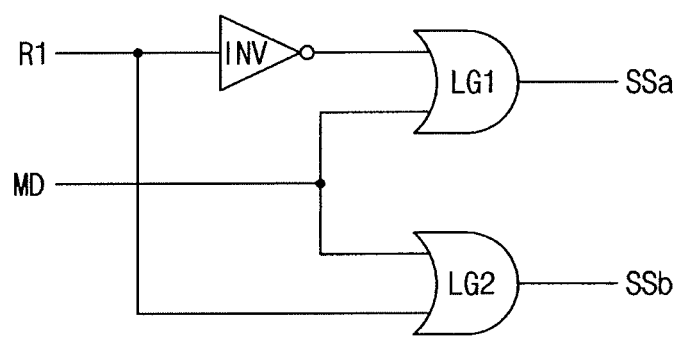
FIGS. 11 and 12 illustrate diagrams of example embodiments of a switch control circuit included in a nonvolatile memory device according to an example embodiment.
Figure 12:
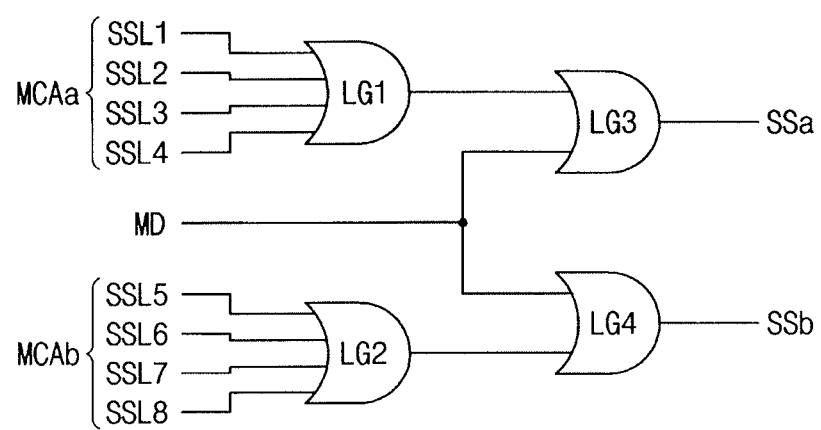

FIGS. 11 and 12 are diagrams illustrating example embodiments of a switch control circuit included in a nonvolatile memory device according to an example embodiment.

Referring to FIGS. 9, 10, and 11, a switch control circuit 481 may include an inverter INV, a first logic gate LG1, and a second logic gate LG2. For example, the first and second logic gates LG1 and LG2 may be implemented with OR logic gates.

The first logic gate LG1 performs a logic operation on an inversion bit of an uppermost string selection bit R1 and the mode signal MD to generate the first switch signal SSa. The uppermost string selection bit R1 corresponds to the first bit R1 in FIG. 10, which is a most significant bit among string selection bits R1, R2, and R3 determining selected cell strings among the plurality of cell strings. The mode signal MD indicates the program operation, the read operation or the erase operation. The second logic gate LG2 performs a logic operation on the uppermost string selection bit R1 and the mode signal MD to generate the second switch signal SSb.

As a result, when the mode signal MD indicates the program operation or the read operation, the switch control circuit 481 may activate selectively one of the first switch signal SSa and the second switch signal SSb to the logic high level H based on one address bit R1 among bits of the access address, where the one address bit R1 indicates whether the selected memory cells are included in the first sub array MCAa or the second sub array MCAb. In contrast, the mode signal MD indicates the erase operation, the switch control circuit 481 may activate both of the first switch signal SSa and the second switch signal SSb to the logic high level H regardless of the access address.

Referring to FIGS. 9, 10, and 12, a switch control circuit 482 may include a first logic gate LG1, a second logic gate LG2, a third logic gate LG3, and a fourth logic gate LG4. For example, the first through fourth logic gates LG1~LG4 may be implemented with OR logic gates.

The first logic gate LG1 performs a logic operation on the string selection signals SSL1~SSL4 that select the cell strings in the first sub array MCAa. The second logic gate LG2 performs a logic operation on the selection signals SSL5~SSL8 that select the cell strings in the second sub array MCAb. The third logic gate LG3 performs a logic operation on an output of the first logic gate LG1 and the mode signal MD indicating the program operation, the read operation, or the erase operation to generate the first switch signal SSa. The fourth logic gate LG4 performs a logic operation on an output of the second logic gate LG2 and the mode signal MD to generate the second switch signal SSb.

As a result, when the mode signal MD indicates the program operation or the read operation, the switch control circuit 482 may activate selectively one of the first switch signal SSa and the second switch signal SSb to the logic high level H based on the string selection signals SSL1~SSL8 provided by decoding the access address. In contrast, when the mode signal MD indicates the erase operation, the switch control circuit 482 may activate both of the first switch signal SSa and the second switch signal SSb to the logic high level H regardless of the access address.

Figure 13:
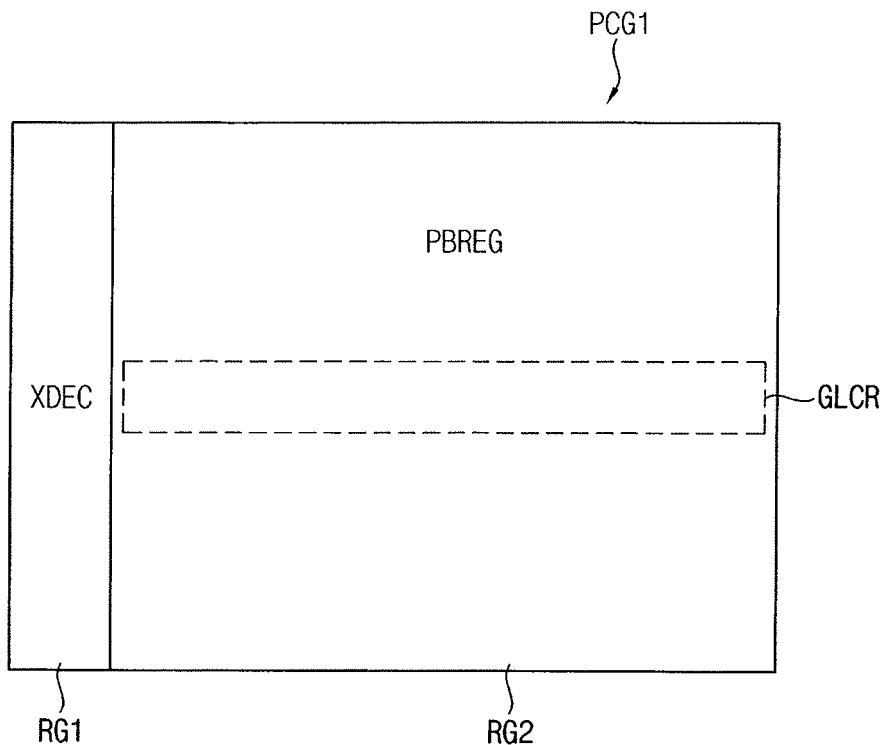
FIGS. 13, 14 and 15 illustrate diagrams of example layouts of a peripheral circuit region of a nonvolatile memory device according to an example embodiment.
Figure 14:
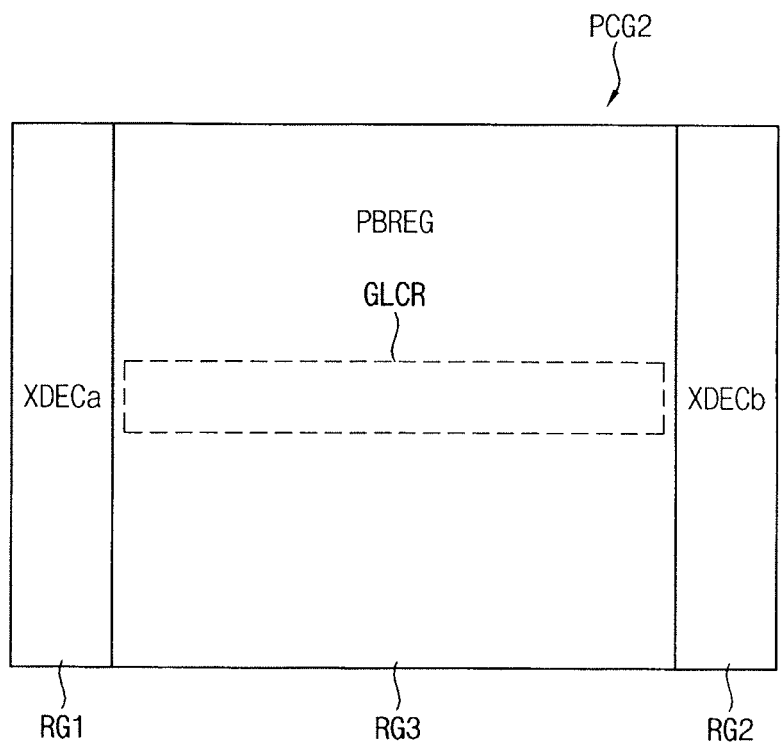
Figure 15:
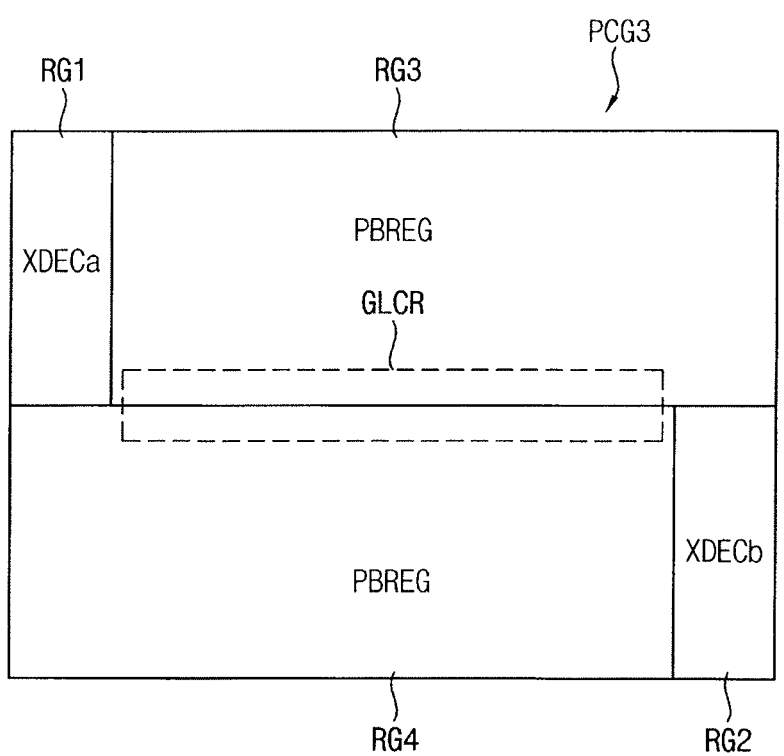

FIGS. 13, 14, and 15 are diagrams illustrating example layouts of a peripheral circuit region of a nonvolatile memory device according to an example embodiment.

Referring to FIG. 13, a peripheral circuit region PCR1 may be divided into a first region RG1 and a second region RG2. An address decoder XDEC may be formed in the first region RG1 and the page buffer region PBREG may be formed in the second region RG2. Through the layout of FIG. 13, the address decoder XDEC may cover the column-directional length of the gate line arrangement and the page buffer region PBREG may cover the row-directional length of the bitline arrangement.

The column-directional central region GLCR of the second region R2 corresponding to the memory cell region MCR may be the gate line cut region, and the plurality of first vertical conduction paths VCPa and the plurality of second vertical conduction paths VCPb may be formed in the gate line cut region GLCR, as described above.

Referring to FIG. 14, an address decoder XDEC may be divided into two sub decoders XDECa and XDECb and a peripheral circuit region PCR2 may be divided into a first region RG1, a second region RG2, and a third region R3. The sub decoders XDECa and XDECb may be formed in the first and second regions RG1 and RG2, respectively, and the page buffer region PBREG may be formed in the third region RG3. Through the layout of FIG. 14, each of the sub decoders XDECa and XDECb may cover the column-directional length of the gate line arrangement, and the page buffer region PBREG may cover the row-directional length of the bitline arrangement.

The column-directional central region GLCR of the third region R3 corresponding to the memory cell region MCR may be the gate line cut region, and the plurality of first vertical conduction paths VCPa and the plurality of second vertical conduction paths VCPb may be formed in the gate line cut region GLCR, as described above.

Referring to FIG. 15, an address decoder XDEC may be divided into two sub decoders XDECa and XDECb and a peripheral circuit region PCR2 may be divided into first through fourth regions RG1~R4. The sub decoders XDECa and XDECb may be formed in the first and second regions RG1 and RG2, respectively, and the page buffer region PBREG may be formed in the third and fourth regions RG3 and RG4. Through the layout of FIG. 15, each of the sub decoders XDECa and XDECb may cover one half of the column-directional length of the gate line arrangement, and the page buffer region PBREG may cover the row-directional length of the bitline arrangement.

The column-directional central region GLCR between the third region R3 and the fourth region R4 corresponding to the memory cell region MCR may be the gate line cut region, and the plurality of first vertical conduction paths VCPa and the plurality of second vertical conduction paths VCPb may be formed in the gate line cut region GLCR, as described above.

Figure 16:
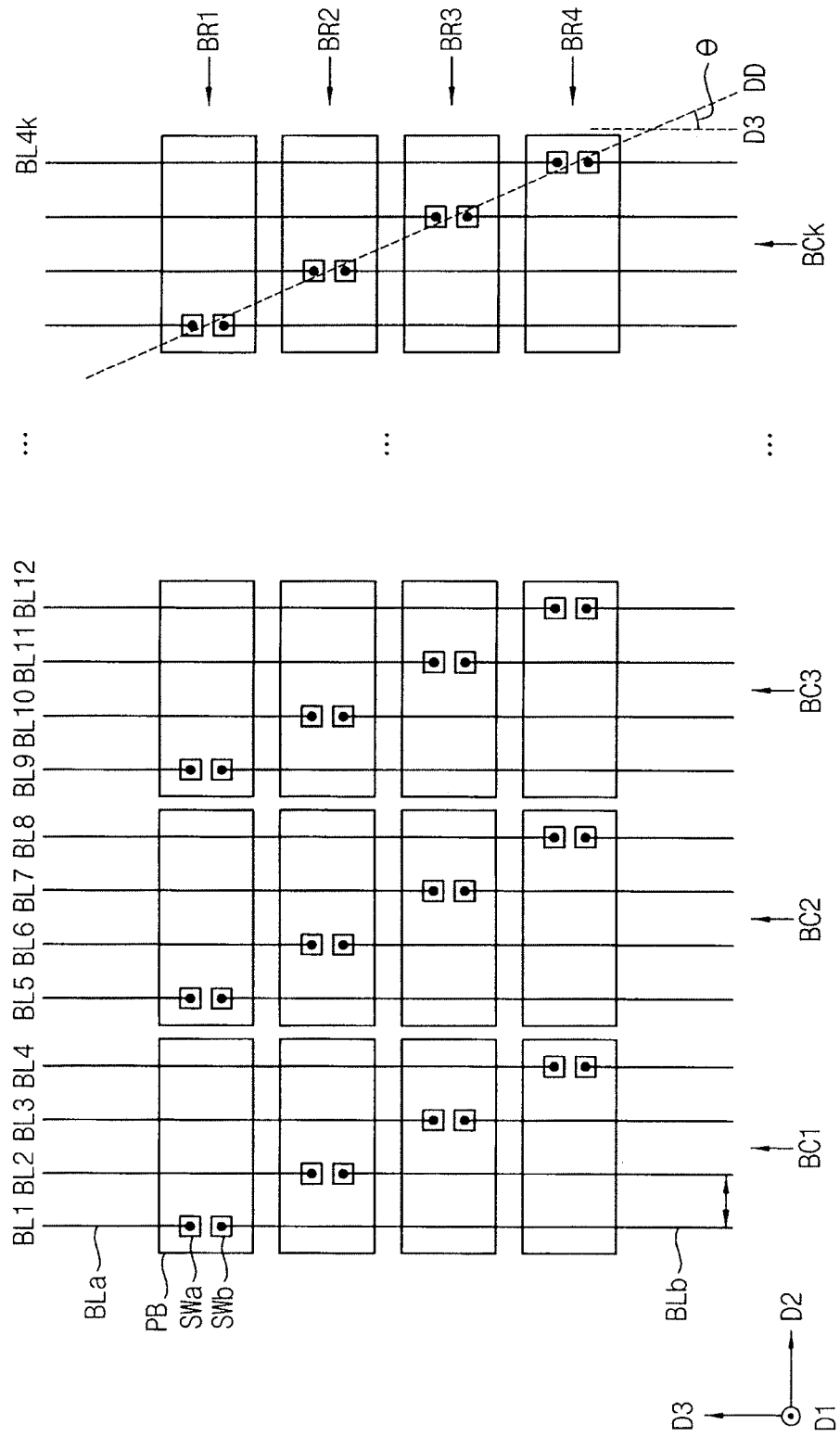
FIG. 16 illustrates a diagram of an example embodiment of a connection structure between page buffers and bitlines.

FIG. 16 is a diagram illustrating an example embodiment of a connection structure between page buffers and bitlines.

Referring to FIG. 16, a plurality of buffers PB may be arranged in a matrix of a plurality of rows BR1~BR4 and a plurality of columns BC1~BCk. FIG. 16 illustrates an example where the plurality of page buffers PB are arranged in the four rows BR1~BR4 for convenience of illustration. The row number of the page buffers may be determined variously.

As described above, the plurality of first switches SWa may electrically connect the plurality of first vertical conduction paths VCPa and the plurality of page buffers PB in response to a first switch signal SSa. Accordingly, the plurality of first bitline segments BLa may be electrically connected to the plurality of page buffers PB through the plurality of first vertical conduction paths VCPa and the plurality of first switches SWa. The plurality of second switches SWb may electrically connect the plurality of second vertical conduction paths VCPb and the plurality of page buffers PB in response to a second switch signal SSb. Accordingly, the plurality of second bitline segments BLb may be electrically connected to the plurality of page buffers PB through the plurality of second vertical conduction paths VCPb and the plurality of second switches SWb.

As illustrated in FIG. 16, the bitlines connected to the page buffers PB of the same column may be cut sequentially along a diagonal direction DD making an acute angle θ with the column direction D3. For example, the bitlines BL1~BL4 corresponding to the first column BC1 may be sequentially along the diagonal direction DD, the bitlines BL5~BL8 corresponding to the second column BC2 may be sequentially along the diagonal direction DD, and so on.

Through the matrix arrangement of the page buffers PB and the diagonal bitline cut of FIG. 16, the design margin may be enhanced, and deviation of lengths of the bitline segments BLa and BLb may be reduced to reduce deviation of bitline loads.

Figure 17:
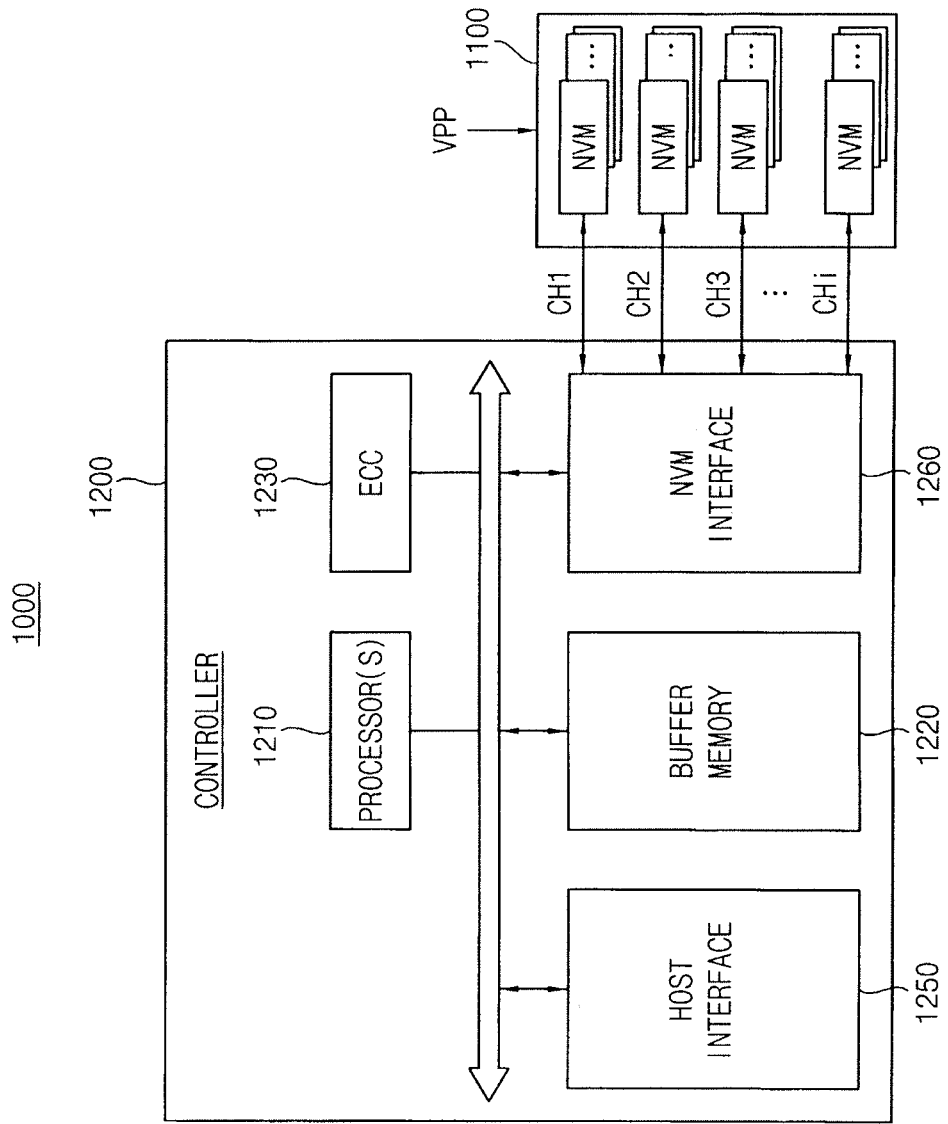
FIG. 17 illustrates a block diagram of a solid state disk or solid state drive (SSD) according to an example embodiment.

FIG. 17 is a block diagram illustrating a solid state disk or solid state drive (SSD) according to an example embodiment.

Referring to FIG. 17, an SSD 1000 includes multiple nonvolatile memory devices 1100 and an SSD controller 1200.

The nonvolatile memory devices 1100 may be configured to receive a high voltage VPP. The nonvolatile memory devices 1100 may correspond to the above-described nonvolatile memory devices according to example embodiments. Thus, the nonvolatile memory devices 1100 may include the bitline cut structure for reducing the loads of the bitlines. The nonvolatile memory device 1100 may be a vertical NAND flash memory device having the COP structure.

In the present example embodiment, the SSD controller 1200 is connected to the nonvolatile memory devices 1100 through multiple channels CH1 to CHi. The SSD controller 1200 includes one or more processors 1210, a buffer memory 1220, an error correction code (ECC) circuit 1230, a host interface 1250, and a nonvolatile memory interface 1260. The buffer memory 1220 stores data used to drive the SSD controller 1200. The buffer memory 1220 comprises multiple memory lines each storing data or a command. The ECC circuit 1230 calculates error correction code values of data to be programmed at a writing operation and corrects an error of read data using an error correction code value at a read operation. In a data recovery operation, the ECC circuit 1230 corrects an error of data recovered from the nonvolatile memory devices 1100.

Example embodiments may be applied to various electronic devices and systems. For example, the embodiments may be applied to systems such as a memory card, a solid state drive (SSD), an embedded multimedia card (eMMC), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

By way of summation and review, nonvolatile memory devices having a three-dimensional structure, such as a vertical NAND memory device, have been developed to increase integration degree and memory capacity. Due to the increase in integration degree and memory capacity, a load of a signal line may be increased and operation speed of the nonvolatile memory device may be decreased.

As described above, the nonvolatile memory device, the vertical NAND flash memory device, and the SSD device according to an example embodiment may reduce the loads of the bitlines and enhance performance through bitline cut. Embodiments may provide a nonvolatile memory device and a vertical NAND flash memory device capable of reducing loads of bitlines. Embodiments may provide an SSD device including the nonvolatile memory device having reduced loads of bitlines.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
   a semiconductor substrate including a page buffer region;
   a memory cell array formed in a memory cell region above the semiconductor substrate and including a plurality of memory cells;
   a plurality of bitlines extending in a column direction above the memory cell array, each bitline of the plurality of bitlines being cut into a first bitline segment extending in the column direction and a corresponding second bitline segment extending in the column direction, the first bitline segment being aligned with the corresponding second bitline segment in the column direction, the plurality of bitlines including a plurality of first bitline segments and a plurality of second bitline segments;
   a plurality of first vertical conduction paths extending in a vertical direction and penetrating the memory cell region to connect the plurality of first bitline segments and the page buffer region, each first vertical conduction path being located at an end of a first bitline segment that is proximate to an end of a corresponding second bitline segment; and
   a plurality of second vertical conduction paths extending in the vertical direction and penetrating the memory cell region to connect the plurality of second bitline segments and the page buffer region, each second vertical conduction path being located at an end of a second bitline segment that is proximate to the first vertical conduction path.

2. The memory device as claimed in claim 1, wherein the memory cell array has a single mat structure that is a unit of a program operation, a read operation, and an erase operation.

3. The memory device as claimed in claim 1, wherein one of the plurality of first bitline segments and the plurality of second bitline segments is electrically connected to a plurality of page buffers included in the page buffer region during a program operation and a read operation.

4. The memory device as claimed in claim 1, wherein both of the plurality of first bitline segments and the plurality of second bitline segments are electrically connected to a plurality of page buffers included in the page buffer region during an erase operation.

5. The memory device as claimed in claim 1, wherein the memory cell array includes a plurality of cell strings, each cell string including memory cells arranged in a vertical direction, and the memory device is a vertical NAND flash memory device.

6. The memory device as claimed in claim 5, wherein each bitline of the plurality of bitlines is cut in a gate cut region, and the plurality of first vertical conduction paths and the plurality of second vertical conduction paths are formed in the gate cut region.

7. The memory device as claimed in claim 1, wherein the page buffer region includes:
   a plurality of page buffers;
   a plurality of first switches configured to electrically connect the plurality of first vertical conduction paths and the plurality of page buffers in response to a first switch signal; and
   a plurality of second switches configured to electrically connect the plurality of second vertical conduction paths and the plurality of page buffers in response to a second switch signal.

8. The memory device as claimed in claim 7, wherein one of the plurality of first switches and the plurality of second switches is selectively turned on in a program operation and a read operation.

9. The memory device as claimed in claim 7, wherein both of the plurality of first switches and the plurality of second switches are turned on in an erase operation.

10. The memory device as claimed in claim 7, further comprising:
    a switch control circuit configured to generate the first switch signal and the second switch signal based on a mode signal indicating a program operation, a read operation, or an erase operation and an access address determining selected memory cells among the plurality of memory cells.

11. The memory device as claimed in claim 10, wherein the memory cell array is divided into a first sub array connected to the plurality of first bitline segments and a second sub array connected to the plurality of second bitline segments.

12. The memory device as claimed in claim 11, wherein, when the mode signal indicates the program operation or the read operation, the switch control circuit activates selectively one of the first switch signal and the second switch signal based on one address bit among bits of the access address, the one address bit indicating whether the selected memory cells are included in the first sub array or the second sub array.

13. The memory device as claimed in claim 11, wherein, when the mode signal indicates the program operation or the read operation, the switch control circuit activates selectively one of the first switch signal and the second switch signal based on string selection signals provided by decoding the access address.

14. The memory device as claimed in claim 11, wherein, when the mode signal indicates the erase operation, the switch control circuit activates both of the first switch signal and the second switch signal regardless of the access address.

15. The memory device as claimed in claim 10, wherein:
    the memory cell array includes a plurality of cell strings, each cell string including memory cells arranged in a vertical direction, and
    the switch control circuit includes:
    a first logic gate configured to perform a logic operation on an inversion bit of an uppermost string selection bit and a mode signal to generate the first switch signal, the uppermost string selection bit being a most significant bit among string selection bits determining selected cell strings among the plurality of cell strings, the mode signal indicating a program operation, a read operation, or an erase operation; and
    a second logic gate configured to perform a logic operation on the uppermost string selection bit and the mode signal to generate the second switch signal.

16. The memory device as claimed in claim 10, wherein:
    the memory cell array is divided into a first sub array connected to the plurality of first bitline segments and a second sub array connected to the plurality of second bitline segments, and the memory cell array includes a plurality of cell strings, each cell string including memory cells arranged in a vertical direction, and the switch control circuit includes:
- a first logic gate configured to perform a logic operation on first string selection signals that select the cell strings in the first sub array;
- a second logic gate configured to perform a logic operation on second string selection signals that select the cell strings in the second sub array;
- a third logic gate configured to perform a logic operation on an output of the first logic gate and a mode signal indicating a program operation, a read operation, or an erase operation to generate the first switch signal; and
- a fourth logic gate configured to perform a logic operation on an output of the second logic gate and the mode signal to generate the second switch signal.

17. The memory device as claimed in claim 1, wherein the page buffer region includes:
- a plurality of page buffers that are arranged in a matrix of a plurality of rows and a plurality of columns;
- a plurality of first switches configured to electrically connect the plurality of first vertical conduction paths and the plurality of page buffers in response to a first switch signal; and
- a plurality of second switches configured to electrically connect the plurality of second vertical conduction paths and the plurality of page buffers in response to a second switch signal.

18. The memory device as claimed in claim 17, wherein:
- in plan view, the first bitline segment and the corresponding second bitline segment are aligned on a first virtual line, which extends in the column direction, and
- in plan view, the bitlines connected to the page buffers of the same column are cut sequentially along a second virtual line, which extends in a diagonal direction, the second virtual line making an acute angle with first virtual line extending in the column direction.

19. A vertical NAND flash memory device having a cell over periphery (COP) structure in which a peripheral circuit is formed on a semiconductor substrate and a memory cell array is stacked on the peripheral circuit, the vertical NAND flash memory device comprising:
- a semiconductor substrate including a page buffer region;
- a memory cell array formed in a memory cell region above the semiconductor substrate and including a plurality of cell strings, each cell string including memory cells arranged in a vertical direction;
- a plurality of bitlines extending in a column direction above the memory cell array, each bitline of the plurality of bitlines being cut into a first bitline segment extending in the column direction and a corresponding second bitline segment extending in the column direction, the first bitline segment being aligned with the corresponding second bitline segment in the column direction, the plurality of bitlines including a plurality of first bitline segments and a plurality of second bitline segments;
- a plurality of first vertical conduction paths extending in a vertical direction and penetrating the memory cell region to connect the plurality of first bitline segments and the page buffer region, each first vertical conduction path being located at an end of a first bitline segment that is proximate to an end of a corresponding second bitline segment; and
- a plurality of second vertical conduction paths extending in the vertical direction and penetrating the memory cell region to connect the plurality of second bitline segments and the page buffer region, each second vertical conduction path being located at an end of a second bitline segment that is proximate to the first vertical conduction path.

20. A solid state drive (SSD), comprising:
- a plurality of nonvolatile memory devices; and
- an SSD controller configured to control the plurality of nonvolatile memory devices,
- at least one of the plurality of nonvolatile memory devices including:
  - a semiconductor substrate including a page buffer region;
  - a memory cell array formed in a memory cell region above the semiconductor substrate and including a plurality of memory cells;
  - a plurality of bitlines extending in a column direction above the memory cell array, each bitline of the plurality of bitlines being cut into a first bitline segment extending in the column direction and a corresponding second bitline segment extending in the column direction, the first bitline segment being aligned with the corresponding second bitline segment in the column direction, the plurality of bitlines including a plurality of first bitline segments and a plurality of second bitline segments;
  - a plurality of first vertical conduction paths extending in a vertical direction and penetrating the memory cell region to connect the plurality of first bitline segments and the page buffer region, each first vertical conduction path being located at an end of a first bitline segment that is proximate to an end of a corresponding second bitline segment; and
  - a plurality of second vertical conduction paths extending in the vertical direction and penetrating the memory cell region to connect the plurality of second bitline segments and the page buffer region, each second vertical conduction path being located at an end of a second bitline segment that is proximate to the first vertical conduction path.

* * * * *